United States Patent [19]
Bailey et al.

[11] Patent Number: 5,076,206
[45] Date of Patent: Dec. 31, 1991

[54] VERTICAL LPCVD REACTOR

[75] Inventors: Dane E. Bailey; Thomas E. Tang, both of Dallas, Tex.

[73] Assignee: Texas Instruments Incorporated, Dallas, Tex.

[21] Appl. No.: 606,234

[22] Filed: Oct. 31, 1990

[51] Int. Cl.⁵ .............................................. C23C 16/00
[52] U.S. Cl. ..................................... 118/724; 118/725
[58] Field of Search ................................ 118/724, 725

[56] References Cited
U.S. PATENT DOCUMENTS

| 4,640,223 | 2/1987 | Dozier | 118/725 |
|---|---|---|---|
| 4,957,781 | 9/1990 | Kanegae | 118/725 |
| 4,989,540 | 2/1991 | Fuse | 118/725 |
| 4,992,301 | 2/1991 | Shishiguchi | 118/724 |

Primary Examiner—Richard Bueker
Attorney, Agent, or Firm—Robby T. Holland; René E. Grossman; Richard L. Donaldson

[57] ABSTRACT

A vertical low pressure chemical vapor deposition, LPCVD, reactor that may be used to form deposition films on semiconductor wafers is disclosed. The vertical LPCVD reactor has a reaction chamber with a top portion and a bottom portion. A furnace heats the reaction chamber. Deposition gases are introduced into the bottom portion of the reaction chamber by a gas tube having a substantial portion heated by the furnace. Deposition gases are introduced into the top portion of the reaction chamber by a gas tube that is shaped so that a substantial portion of it overlies the top portion of the reaction chamber and is heated by the furnace. By heating the substantial portion of the gas tube overlying the top portion of the reaction chamber, the deposition gases passing through this tube are heated before they enter the top portion of the reaction chamber. This improves the uniformity of deposited films on semiconductor wafers residing in the top portion of the reaction chamber.

9 Claims, 4 Drawing Sheets

VERTICAL LPCVD REACTOR

FIELD OF THE INVENTION

This invention relates to equipment used in the processing of semiconductor integrated circuits and is more particularly related to vertical LPCVD reactors.

BACKGROUND OF THE INVENTION

Modern fabrication of VLSI circuits makes wide use of deposited films on semiconductor wafers. Deposited films have many uses, such as conducting regions within the device, electrical insulation between metals, and protection from the environment. One of the materials most often deposited is polycrystalline silicon. Among other uses, it may be used as the gate electrode material in MOS devices, as a conducting material for multilevel metallization, and as a contact material for devices with shallow junctions. Deposition gases may be pyrolyzed in a low pressure chemical vapor deposition, LPCVD, reactor to form doped silicon films. U.S. Pat. No. 4,877,753, issued 10/31/89, assigned to Texas Instruments Incorporated and incorporated herein by reference discloses in-situ doping of polysilicon using tertiary butyl phosphine. The copending and coassigned patent application of coinventor Tang filed 12/1/90 entitled "Method and Apparatus for In-Situ Doping of Deposited Silicon", Ser. No. 07/444,900, incorporated herein by reference, discloses using deposition gases of silane $SiH_4$ and tertiary butyl phosphine, TBP, $(C_4H_{11})P$ in a LPCVD reactor to form doped amorphous films. LPCVD techniques allow for potential advantages in uniform step coverage, precise control of composition and structure, low temperature processing, fast deposition rates, high throughput, and low processing costs. LPCVD exemplary apparatuses include horizontal and vertical reactors.

FIG. 1 illustrates a typical horizontal LPCVD hot wall reactor. The horizontal reactor 10 has a horizontally positioned quartz tube 11. The inside of quartz tube 11 forms the reaction chamber, process chamber, 11a. Three zone furnace 12 heats quartz tube 11. Gas inlet 13a of gas tube 13 introduces deposition gases into one end of reaction chamber 11a. A pump 14 at the other end pumps out the deposition gases. The semiconductor wafers 15 stand vertically in quartz holder (wafer boat, wafer carrier) 16. Each run typically processes 50 to 200 wafers. The wafer boat 16 is loaded into the quartz tube 11 through the load door 17 located at end of quartz tube 11 near gas inlet 13a. A pressure sensor 18 monitors the pressure within reaction chamber 11a. Pressures in the reaction chamber are typically 30 to 250 Pa (0.25 to 2.0 Torr); temperatures range from between about 300 and 900° C.; and gas flows are generally between about 100 and 1000 std. $cm^3/min$.

FIG. 2 depicts an exemplary vertical LPCVD reactor. Thermco Systems, a division of Silicon Valley Group, Inc., manufactures such a vertical reactor. The vertical reactor 20 has a vertically positioned bell shaped quartz tube 21 about forty three inches in length. Vertical reactor 20 is about fifty inches long. The inside of quartz tube 21 forms the reaction chamber, process chamber, 21a. The inside top belled end of quartz tube 21 presents the top of reaction chamber 21a. Resistive heated furnace element 22 provides heat. The portion of vertical reactor 20 heated by 22 is referred as the "heat zone" of the reactor.

In FIG. 2, the deposition gases are introduced into the reaction chamber 21a through two sources: top gas inlet 230a of top gas tube 230; and, bottom gas inlet 231a of bottom gas tube 231. The portion of top gas tube 230 within the heat zone of vertical reactor 20 is short—only about five inches in length—when compared to the portion of bottom gas tube 231 within the heat zone—about 32 inches in length. A pump, not illustrated, connected to the dual flange plenum 24 draws the deposition gases out of the process chamber 21a.

The semiconductor wafers 25 of the vertical reactor of FIG. 2 lie above one another in the horizontal position in the quartz wafer carrier 26. Quartz wafer carrier 26 rests upon quartz pedestal 29. The quartz pedestal 29 and the wafer carrier 26 are loaded into the process chamber 21a through the load door 27 at the bottom of vertical LPCVD reactor 20. A pressure sensor, not illustrated, connected to pressure sensor tube 28 monitors the pressure and a temperature sensor, not illustrated, attaches to temperature sensor tube 28a to monitor temperature. The pressures, temperatures, and gas flows for vertical LPCVD reactor 20 are similar to those of horizontal LPCVD reactor 10 of FIG. 1.

FIG. 3 illustrates a top view of the outside top belled end of quartz tube 21 of FIG. 2 and shows in particular the routing of top gas tube 230.

A problem exist when using vertical LPCVD reactors to form suitable in-situ doped silicon films such as polysilicon and amorphous silicon on wafers for VLSI submicron circuit devices, such as 16 mega bit dynamic random access memories "16 MB DRAMs". The small geometries of these devices require stringent deposition tolerances throughout the wafers within a lot run in order to have sufficient yield and throughput. The dopant gases passing through the top gas tube do not have sufficient time to heat before entering into the top of the process chamber. These dopant gases enter the top of the reaction chamber essentially unheated and cold; they do not become fully heated and do not reach their decomposition temperature until they reach the lower portion of the reaction chamber; they do not fully decompose until their decomposition temperature is reached; therefore, they do not fully decompose at the upper portion of the process chamber. The dopant gases entering into the reaction chamber 21a through the top of quartz tube 21 through top gas inlet 230a of top gas tube 230 therefore are not as thoroughly incorporated into the formation of in-situ deposited silicon films on the wafers positioned in wafer boat 26 near the upper portion of process chamber 21a. This leads to silicon film thickness problems in the wafers and doping uniformity problems in the wafers causing the wafers in the upper portion of wafer boat 26 to be unsuitable for submicron VLSI 16 MB DRAM processing.

One potential solution to this problem is to simply not run as many wafers in a lot. The reduced number of wafers can all be positioned lower in the wafer carrier 26 so that they reside lower in the reaction chamber 21a, thereby making it more likely that the dopant gases entering the process chamber from the top will be fully decomposed when they reach the wafers. This solution is undesirable, however, because it reduces lot throughput.

It is an object therefore of this invention to provide an improved vertical LPCVD reactor.

Other objects and benefits of this invention will be apparent to those of ordinary skill in the art having the benefit of the description to follow herein.

SUMMARY OF THE INVENTION

A vertical low pressure chemical vapor deposition, LPCVD, reactor that may be used to form deposition films on semiconductor wafers is disclosed. The vertical LPCVD reactor has a reaction chamber with a top portion and a bottom portion. A furnace heats the reaction chamber. Deposition gases are introduced into the bottom portion of the reaction chamber by a gas tube having a substantial portion heated by the furnace. Deposition gases are introduced into the top portion of the reaction chamber by a gas tube that is shaped so that a substantial portion of it overlies the top portion of the reaction chamber and is heated by the furnace. By heating the substantial portion of the gas tube overlying the top portion of the reaction chamber, the deposition gases passing through this tube are heated before they enter the top portion of the reaction chamber. This improves the nature of deposited films on semiconductor wafers residing in the top portion of the reaction chamber.

DETAILED DESCRIPTION OF THE PREFERRED EMBODIMENT

Figure 4:
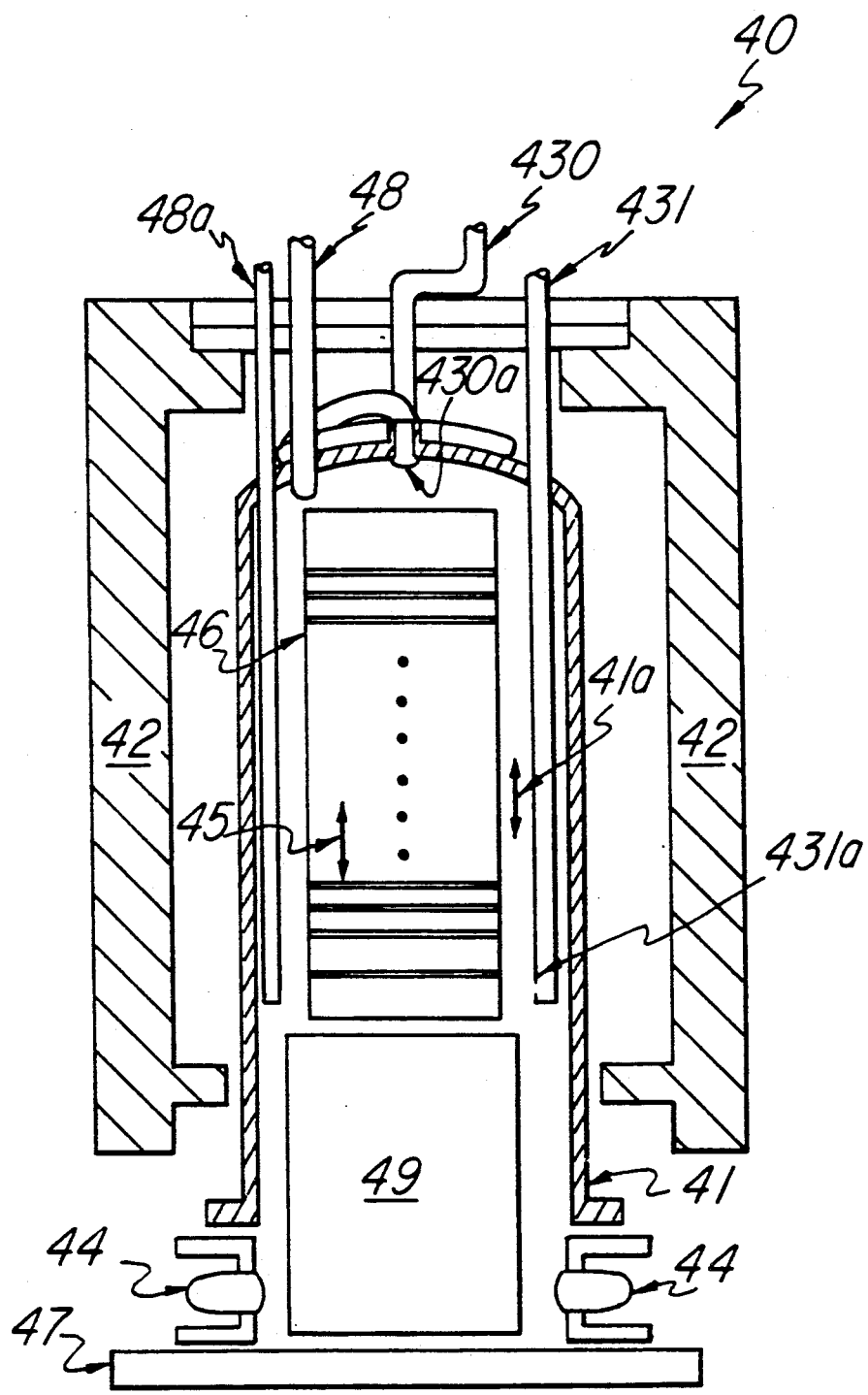
FIG. 4 is a block drawing illustrating the preferred embodiment of the inventive LPCVD reactor.
Figure 3:
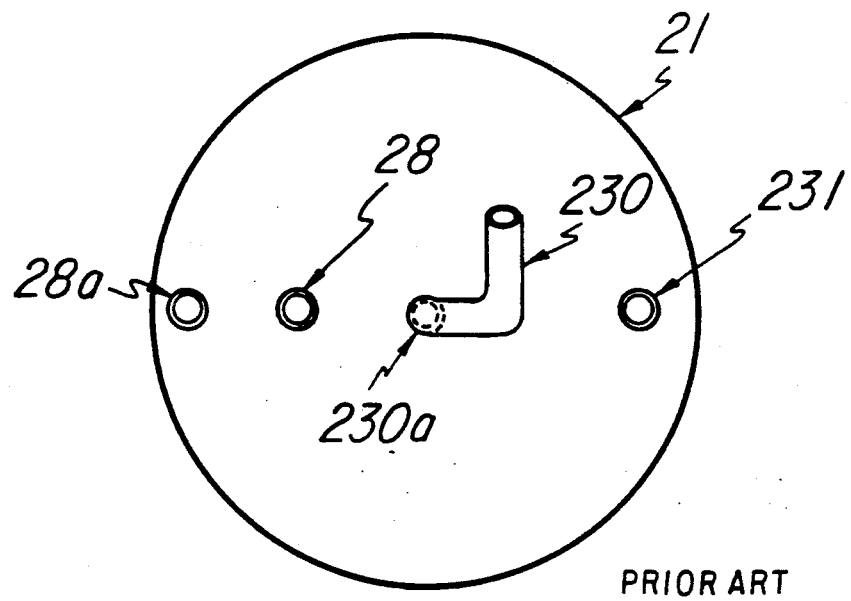
FIG. 3 illustrates a top view of the prior art belled end of the quartz tube of FIG. 2 and shows the routing of the top gas tube.

FIG. 4 discloses the preferred embodiment of the inventive vertical LPCVD reactor. The vertical reactor 40 has a length of about fifty inches. The length of it's vertically positioned bell shaped quartz tube 41 is about 43 inches. The inside of quartz tube 41 forms the reaction chamber 41a. The outside diameter of quartz tube 41 is about eleven inches. The inside top portion of reaction chamber 41a located near the belled end of quartz tube 41 presents the top portion of reaction chamber 41a. Furnace element 42 heats the process chamber 41a.

In FIG. 4, the deposition gases are introduced into the reaction chamber 41a through two sources: top gas inlet 430a of top gas tube 430, located at the top of reaction chamber 41a; and, lower gas inlet 431a of lower gas tube 431, located in the lower half of process chamber 41a. The dual flange plenum 44 connects to a pump, not shown, that draws the deposition gases out of reaction chamber 41a.

Figure 1:
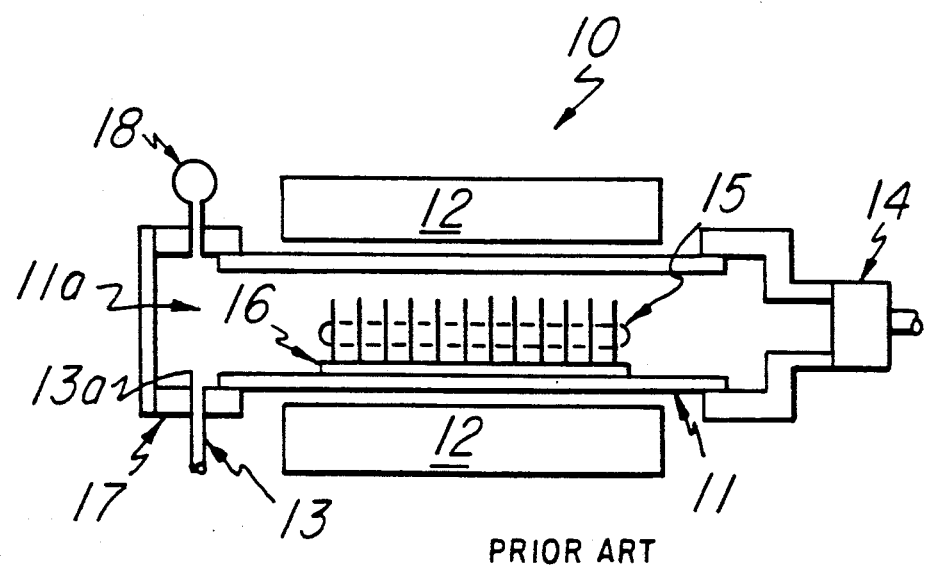
FIG. 1 is a block drawing of a prior art horizontal LPCVD reactor.

The semiconductor wafers 45 of FIG. 4 lie in a stack, above one another, horizontal in the quartz wafer carrier 46. Quartz wafer carrier 46 may hold up to about 150 semiconductor wafers. Wafer number one is the first wafer in the upper portion of wafer carrier 46 near the top of the reaction chamber 41a while wafer one hundred and fifty is the location of the last wafer in the lower portion of quartz wafer carrier 46 next to quartz pedestal 49. Quartz wafer carrier 46 rests upon quartz pedestal 49. The quartz pedestal 49 and the wafer carrier 46 are loaded into the process chamber 41a through the load door 47 at the bottom of vertical LPCVD reactor 40. A pressure sensor, not illustrated, attaches to pressure sensor tube 48 to monitor the pressure within the process chamber and a temperature sensor, not illustrated, attaches to temperature sensor tube 48a to monitor temperature. The temperatures and pressures and gas flows for reactor 40 during processing is similar to those described above for horizontal reactor 10 of FIG. 1.

The routing of top gas tube 430 places a substantial portion of it within the heat zone of vertical reactor 40 so that the dopant gases passing through it will be sufficiently externally preheated heated by furnace 42 before they enter into the top of reaction chamber 41a through top gas inlet 430a. Although other lengths of routing are appropriate to ensure that the dopant gases are properly heated, in the preferred embodiment, the routing length of the portion of top gas tube 430 within the heat zone of vertical reactor 40 is around about thirty five inches. Lengths between about 32 to 37 inches are suitable as proven in the below described test. The middle portion of top gas tube 430 lies in a serpentine fashion over the outer top of quartz tube 41 beneath the top end of vertical reactor 40. It has a helical appearance. By placing the top gas tube 430 around about the top of quartz tube 41, the effective length of the tube within the heat zone of the vertical reactor can be increased without increasing the overall length of the reactor.

Figure 5:
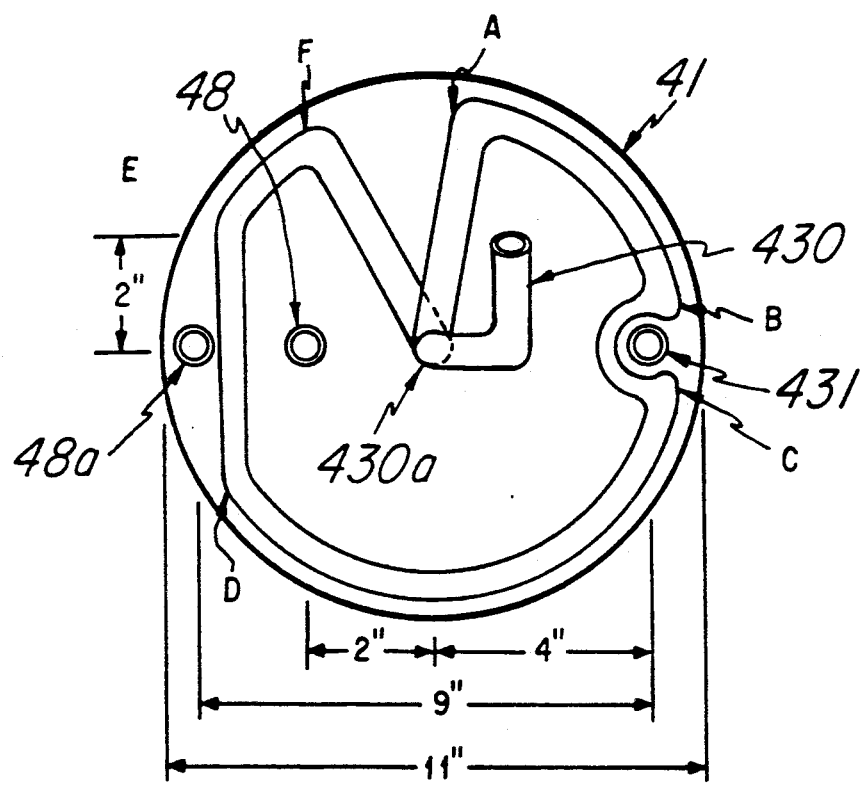
FIG. 5 depicts the top of the belled end of the quartz tube of FIG. 4 and shows the routing of the top gas tube.

FIG. 5 depicts the outside belled end of quartz tube 41 of FIG. 4 illustrating the winding nature of the middle portion of top gas tube 430 over it. The outside diameter of quartz tube 41 is about eleven inches. The temperature tube 48a and the bottom gas tube 431 are on a diameter of about nine inches. The distance between the entrance of top gas tube 430 into quartz tube 41 at top gas inlet 430a and the entrance of bottom gas tube 431 into quartz tube 41 is about four inches. The distance between the entrance of top gas tube 430 into quartz tube 41 and the entrance of the pressure sensor 48 into quartz tube 41 is about two inches. The offset drop of top gas tube 430 and pressure sensor tube 48 is about two inches.

Top gas tube 430 of FIG. 5 is bent from over the top gas inlet 430a to point A near the edge of quartz tube 41; it follows near the edge of quartz tube 41 to point B; it is bent to point C to bypass bottom gas tube 431; it follows near the edge of quartz tube 41 to point D; it is bent to point E to bypass the temperature probe tube 48a; it follows near the edge of quartz tube 41 to point F; it is bent to point A where the insertion into the top of quartz tube 41 occurs. The view illustrates the nature of the serpentine coiled winding shape of top gas tube 430 over the external belled end of quartz tube 41. Other shapes are suitable to increase the length of top gas tube 430 within the heated zone of vertical reactor 40 so that the deposition gases passing through are externally preheated prior to entering the reaction chamber. One example is a shape resembling a bow-tie or a butterfly that is bent to bypass the tubes entering into the outside top belled end of vertical quartz tube 41.

Tests confirm that routing a substantial portion of the top gas line through the heat zone of the vertical LPCVD reactor so that the dopant gases are heated prior to entering the process chamber achieves better uniformity, higher doping concentration, and increases the useful load size of the vertical LPCVD process chamber. The same processing conditions were ran on the vertical LPCVD reactor of FIG. 2 and on the inventive vertical LPCVD reactor of FIG. 4.

Figure 2:
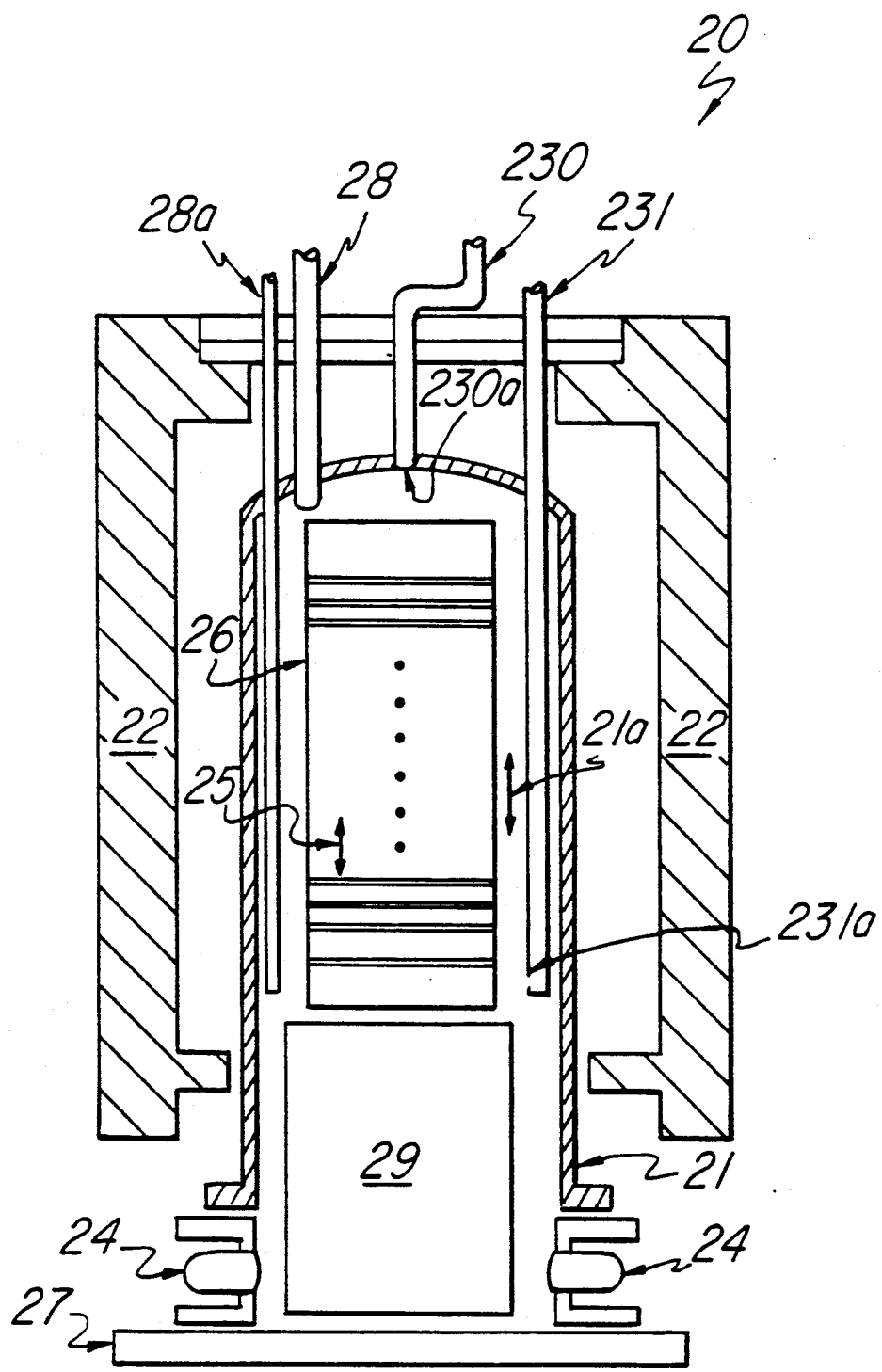
FIG. 2 is a block drawing of a prior art vertical LPCVD reactor.

Appendix 1 contains the test data and results for the prior art vertical LPCVD reactor of FIG. 2; appendix 2 contains the test data and results for the vertical LPCVD reactor of FIG. 4 having a top gas tube 430 portion within the heat zone of the reactor of about thirty two inches in the serpentine shape; appendix 3 contains the test data and results for the vertical LPCVD reactor of FIG. 4 having a gas tube 430 portion within the heat zone of the reactor of about thirty seven inches in the butterfly or bow-tie shape. Appendix 3 reveals that the inventive vertical reactor yielded an overall load polysilicon film thickness sigma of 138 angstroms with a variance of 5% and an overall load sigma restivity of 6.1 ohms/square with a variance of 15.3%. Appendix 2 reveals that the inventive vertical reactor yielded an overall load polysilicon film thickness sigma of 346 angstroms with a variance of 15.3% and an overall load sigma restivity of 4.51 ohms/square with a variance of 12.1%. Appendix 1 reveals that the prior art vertical reactor yielded an overall polysilicon load thickness sigma of 85.5 angstroms with a variance of 3.1% and an overall load sigma restivity of 30.8 ohms/square with a variance of 34.5%. Appendices 1, 2, and 3, are incorporated into and form a part of this specification.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

APPENDIX 1

TYPICAL VERTICAL LPCVD REACTOR

Process Conditions:
Top $SiH_4$ 200 SCCM
Bottom $SiH_4$ 200 SCCM
Top TBP 0.6 SCCM
Bottom TBP 0.6 SCCM
Pressure 400 m Torr
Delay Time = 01:40:00

Load Size = 150 wafers
Temperature
Top 560° C.
Center 560° C.
Bottom 560° C.

MEASUREMENT RESULTS
Thickness (Å)/$R_s$ (Ω/□)

| Wafer Location | 70 | 100 | 120 | 135 |
|---|---|---|---|---|
| Top | 2753/57 | 2761/106 | 2767/113 | 2753/71 |
| Center | 2756/66 | 2702/114 | 2697/135 | 2769/108 |
| Flat | 2444/35 | 2749/79 | 2766/106 | 2715/82 |
| Left | 2687/49 | 2784/98 | 2767/102 | 2617/61 |
| Right | 2689/52 | 2804/97 | 2694/128 | 2767/135 |
| Wafer Average | 2666/52 | 2760/99 | 2738/117 | 2724/91.4 |
| Wafer σ | 128/11.4 | 39/13 | 39/14 | 64/30 |
| Load *X̄ | 2721 Å; | 89.2 Ω/□ | | |
| Load $\sigma_{N-1}$ | 85.5 Å var = 3.1%; | | 30.8 Ω/□ var = 34.5% | |

APPENDIX 2

INVENTIVE VERTICAL LPCVD REACTOR

Process Conditions:
Top $SiH_4$ 200 SCCM
Bottom $SiH_4$ 200 SCCM
Top TBP 0.6 SCCM
Bottom TBP 0.6 SCCM
Pressure 400 m Torr Top Gas Tube Length ≈ 32 inches
Load Size = 150 wafers
Temperature
Top 560° C.
Center 560° C.
Bottom 560° C.

Delay Time = 01:35:00

MEASUREMENT RESULTS
Thickness (Å)/$R_s$ (Ω/□)

| Wafer Location | 90 | 115 | 140 |
|---|---|---|---|
| Top | 1778/35 | 2535/36 | 2614/41 |
| Center | 2051/33 | 2488/37 | 2639/44 |
| Flat | 1658/42 | 2217/31 | 2439/35 |
| Left | 1673/46 | 2404/34 | 2525/39 |
| Right | 2000/33 | 2400/33 | 2564/40 |
| Wafer Average | 1831/38 | 2409/34 | 2556/40 |
| Wafer σ | 183/5.9 | 121/2.4 | 79/3.3 |
| Load *X̄ | 2266 Å; | 37.2 Ω/□ | |
| Load $\sigma_{n-1}$ | 346 Å var = 15.3%; | 4.51 Ω/□ var = 12.1% | |

APPENDIX 3

INVENTIVE VERTICAL LPCVD REACTOR

Process Conditions:
Top $SiH_4$ 200 SCCM
Bottom $SiH_4$ 200 SCCM
Top TBP 0.6 SCCM
Bottom TBP 0.6 SCCM
Pressure 400 m Torr
Delay Time = 01:40:00

Top Gas Tube Length ≈ 37 inches
Load Size = 150 wafers
Temperature
Top 560° C.
Center 560° C.
Bottom 560° C.

MEASUREMENT RESULTS
Thickness (Å)/$R_s$ (Ω/□)

| Wafer Location | 70 | 90 | 110 | 120 | 140 |
|---|---|---|---|---|---|
| Top | 2591/30 | 2801/38 | 2818/39 | 2871/48 | 2667/30 |
| Center | 2684/32 | 2798/41 | 2855/47 | 2865/49 | 2827/39 |
| Flat | 2257/29 | 2615/33 | 2845/44 | 2831/42 | 2835/31 |
| Left | 2462/29 | 2751/35 | 2800/43 | 2900/44 | 2805/36 |
| Right | 2598/30 | 2752/38 | 2697/47 | 2805/44 | 2266/29 |
| Wafer Average | 2518/30 | 2743/37 | 2803/44 | 2854/45 | 2680/33 |
| Wafer σ | 166/1.2 | 76/3.1 | 63/3.3 | 37/3.0 | 24/4.3 |
| Load *X̄ | 2770 Å; | | 39.85 Ω/□ | | |
| Load $\sigma_{N-1}$ | 138 Å var = 5%; | | 6.1 Ω/□ var = 15.3% | | |

What is claimed is:

1. A vertical low pressure chemical vapor deposition, LPCVD, reactor, comprising:
   a reaction chamber having a top portion and a bottom portion;
   a furnace to heat the reaction chamber;
   a gas tube to provide a deposition gas into the bottom portion of the reaction chamber, a substantial portion of the gas tube being heated by the furnace; and
   a gas tube to provide a deposition gas into the top of the reaction chamber, shaped so that a substantial portion of it overlies the top portion of the reaction chamber and is heated by the furnace.

2. The vertical LPCVD reactor of claim 1 wherein the gas tube to provide a deposition gas into the top of the reaction chamber has a length between a range of about 32 to 37 inches that is heated by the furnace.

3. The vertical LPCVD reactor of claim 2 wherein the gas tube to provide a deposition gas into the top of the reaction chamber is shaped in a serpentine fashion.

4. The vertical LPCVD reactor of claim 1 wherein the length of portion of the gas tube to provide a deposition gas into the top of the reaction chamber that is heated by the furnace is essentially the same as the length of the portion of the gas tube to provide deposition gas into the bottom of the reaction chamber that is heated by the furnace.

5. A vertical low pressure chemical vapor deposition, LPCVD reactor, comprising:
   a furnace having a upper end and a lower end;
   a quartz tube having a bell shaped upper portion, vertically positioned so that the bell shaped upper portion lies within the furnace near the upper end of the furnace, and having a lower portion into which semiconductor wafers may be placed for processing;
   a gas tube having a first end for coupling to a deposition gas, a second end for providing the deposition gas into the lower portion of the quartz tube, and having a middle portion that is heated by the furnace; and
   a top gas tube having a first end for coupling to a deposition gas, a second end inserted through the bell shaped top portion of the quartz tube for providing the deposition gas into the upper portion of the quartz tube, and a middle portion overlying the top bell shaped portion of the quartz tube, between the top bell shaped portion of the quartz tube and the upper end of the furnace, so that the deposition gas passing through the top gas tube is heated before it enters the upper portion of the quartz tube.

6. The vertical LPCVD reactor of claim 5 wherein the middle portion of the top gas tube is shaped like a coil.

7. The vertical LPCVD reactor of claim 5 wherein the middle portion of the top gas tube is shaped like a bow-tie.

8. The vertical LPCVD reactor of claim 6 wherein the length of the middle portion is between about 32 to 37 inches.

9. The vertical LPCVD reactor of claim 6 wherein the length of the middle portion of the top gas tube is substantially the same as the length of the middle portion of the gas tube.

* * * * *